Figure 1:
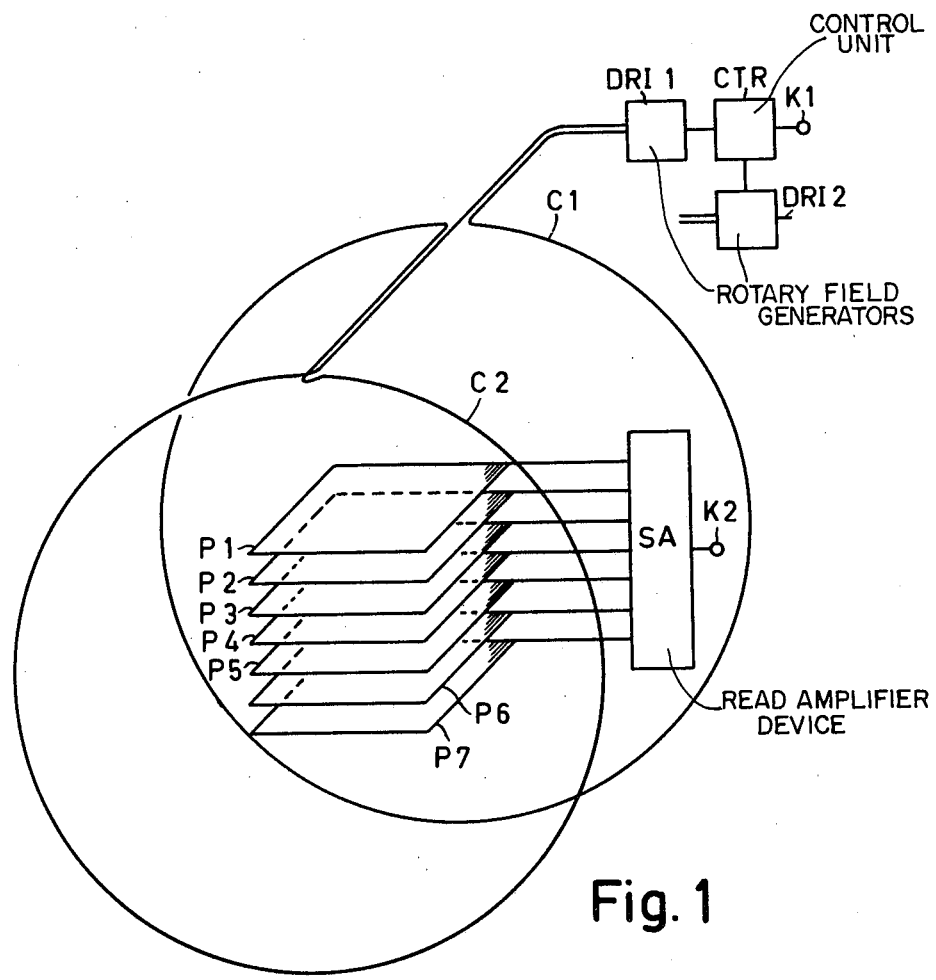

United States Patent [19]

Kuijpers et al.

[11] 4,091,459
[45] May 23, 1978

[54] STORE COMPRISING DRIVABLE DOMAINS

[75] Inventors: Franciscus Antonius Kuijpers; Adrianus Wilhelmus Maria van den Enden; Antonius Henricus Albertus Maria Roovers, all of Eindhoven, Netherlands

[73] Assignee: U.S. Philips Corporation, New York, N.Y.

[21] Appl. No.: 692,056

[22] Filed: Jun. 2, 1976

Related U.S. Application Data

[63] Continuation of Ser. No. 522,051, Nov. 8, 1974, abandoned.

[30] Foreign Application Priority Data

Nov. 26, 1973 Netherlands .................... 7316107
Mar. 25, 1974 Netherlands .................... 7403967

[51] Int. Cl.² ............................................. G11C 19/08
[52] U.S. Cl. ........................................ 365/13; 365/2; 365/32; 365/39
[58] Field of Search ................................ 340/174 TF

[56] References Cited

U.S. PATENT DOCUMENTS

3,770,895 11/1973 Krupp .................... 340/174 TF

*Primary Examiner*—James W. Moffitt
*Attorney, Agent, or Firm*—Frank R. Trifari; Daniel R. McGlynn

[57] ABSTRACT

A storage device comprising a main magnetic field generator, a rotary magnetic field generator and a number of plates of magnetic material which are arranged transverse to the main magnetic field and in which magnetic domains can be formed and transported along a domain guide structure consisting of discrete element. The domain guide structure comprises a switching device incorporating diverging switches which are arranged according to four orientations which correspond to corresponding orientations of discrete elements of said domain guide structure. The domain guide structures comprise diverging switches which may be arranged to be shifted with respect to each other over one or more discrete elements of the domain guide structure in different plates, each plate having a specific rotary magnetic field sequence.

11 Claims, 13 Drawing Figures

STORE COMPRISING DRIVABLE DOMAINS

This is a continuation of application Ser. No. 522,051, filed Nov. 8, 1974 now abandoned.

The invention relates to a storage device, comprising a main magnetic field generator, a rotary magnetic field generator, and a plate of magnetic material in which magnetic domains can be sustained by a field of the main magnetic field generator which is directed transverse to the plate, the said domains being drivable, under the control of a field of the rotary magnetic field generator, along a domain guide structure which consists of discrete elements and which comprises an input structure, a storage structure, and a switching device along which domains can be driven as desired under the control of a rotary magnetic field sequence, and furthermore comprising a domain generating device which is connected to the input structure, the storage device also comprising a domain detection device and a domain destruction device. A known kind of domain is the so-termed magnetic bubble. A storage device of this kind is known from the article by P. C. Michaelis and I. Danylchuk: "Magnetic bubble Repertory Dialer Memory", "Proceedings" 1971 Intermag. Conference, IEEE Transactions on magnetics, September 1971, pages 737–740. This article describes a storage device comprising a storage structure consisting of a major loop and 38 storage loops in which 48 words of 76 bits can be stored: each storage loop contains two bits of each word. Each storage loop is connected to the major loop via a diverging switch which serves as the input switch, and a converging switch which serves as the output switch. A diverging switch is to be understood to mean herein a domain guide structure having one input and two possible outputs. A converging switch is to be understood to mean herein a domain guide structure having two possible inputs and one output. The two types of switch can sometimes change over into each other by reversal of the sense of rotation of the rotary magnetic field. The definition is applicable to the transport direction of the domains during normal use of the storage device. A diverging switch is changed over in that the sense of rotation of the rotary magnetic field is reversed, for example, for one period. The storage loops comprise a converging switch as the input switch and a diverging switch as the output switch. When the rotary magnetic field rotates in the "normal" sense, the domains can continuously circulate in the storage loops in which they are stored. The capacity of the said store is 3648 bits. In order to increase the capacity the length or the number of storage loops can be increased. The read access time is then prolonged: in rotary magnetic field periods this time on the average equals half the length of a storage loop, increased by at least half the part of the major loop comprising the output switches of the storage loops. Therefore, the access time is roughly proportional to the square root of the storage capacity. Writing requires about as much time as reading. Increasing the storage capacity has a further drawback in that the surface area of the plate becomes larger. Beyond a given dimension, the manufacturing yield substantially decreases. A number of such storage devices can be used in parallel, but in that case each time separate rotary magnetic field generators and the like are required, and the required space is also large. Moreover, there is a problem because a main magnetic field generator must generate a sufficiently homogeneous field over a large area. The problems are solved according to the invention which is characterized in that the said plate forms part of a number of similar and correspondingly orientated plates of magnetic material, comprising at least corresponding domain generating devices and storage structures, the otherwise corresponding switching devices of the respective plates comprising diverging switches which are shifted with respect to each other over discrete elements of the domain guide structures, with the result that a specific code can be formed so as to distinguish each of the individual plates. The presence or absence of coincidence between parts of the rotary magnetic field sequence and the presence of a domain on the input of a diverging switch determines along which output the domain will leave the diverging switch. In different plates the domain generating devices and the storage structures are corresponding, and so are the switching devices as far as the non-shifted diverging switches are concerned. Therein, corresponding and simultaneous maneuvers can be performed by the domains. In the shifted diverging switches, the coincidence can occur for a first plate while it does not occur for a second plate. Domains which have travelled correspondingly thus far, can subsequently follow different paths. A given plate can thus be specifically controlled. A domain in the said plate can then contain a unique information in the sense that this information is stored only in this plate. The specific code can be used in a plurality of ways.

By the shifting of a diverging switch over one or more discrete elements of the domain guide structure, a specific code can be readily realized. The shift may amount to a part of, a complete, or more than one period of the domain guide structure. The specific codes can perform different functions.

It is a further aspect of the invention that a storage device comprises a main magnetic field generator, a rotary magnetic field generator, and a plate of magnetic material in which magnetic domains can be sustained by a field of the main magnetic field generator which is directed transverse to the plate, the said domains being drivable under the control of a field of the rotary magnetic field generator, along a domain guide structure which consists of discrete elements and which comprises an input structure, a storage structure, and a switching device along which the domains can be driven as desired under the control of a rotary magnetic field sequence, and further comprising a domain generating device which is connected to the input structure, the storage device furthermore comprising a domain detection device and a domain destruction device, the switching device comprising diverging switches which are arranged according to four orientations, the said four orientations corresponding to corresponding orientations of discrete elements of the domain guide structure. It is thus possible to realize a very substantial variation in the arrangement of the diverging switches in a single plate already, so that many different functions can be realized.

The switching devices of the various plates, containing the diverging switches which have thus been shifted with respect to each other, preferably comprise two series-connected diverging switches, so that a specific code comprising at least two levels can be formed. A large variety of specific codes can be realized by progressively increasing the shifting of a single diverging switch. This scale increase requires substantial space on a plate of magnetic material, possibly also in other parts of the storage device. A multi-level specific code results in a more compact construction.

The diverging switches, thus capable of forming a specific code, preferably are situated in the respective input structures, with the result that information can be selectively stored. Information which is specific for the relevant plate can be written in by adaptation of the rotary magnetic field sequence to the specific input code.

The diverging switches which can thus form a specific code are preferably situated in output structures which are connected to a domain destruction element per plate, with the result that a specific output code can be formed for selective destruction of the domain information. Information can thus be destroyed in one plate, while the information in the other plate is not applied to the domain destruction device and is maintained because only for the said one plate the rotary magnetic field sequence and the specific output code correspond.

A few further drawbacks can be eliminated by further elaboration of the idea of the invention, i.e.:

1. If the space between successive information-carrying domains (or information-carrying vacant domain locations) is to remain limited, the diverging switching device should comprise many diverging switches in series so as to realize enough different specific input codes.

2. If a large number of diverging switches are connected in series, the passing through the diverging switching device requires proportionally more time. Moreover, each domain of a word to be written must pass through the entire diverging switching device.

This is achieved according to the invention in that per plate the input structure comprises a series connection of a diverging switching device whereby a specific input code can be formed, and a domain splitting device whereby a domain can be repeatedly split in a selected plate. Less time is thus required for the input of an information word comprising many bits in the storage structure because the domain splitting device can now repeatedly split a single introduced domain in order to form a plurality of information bits.

The domain splitting device preferably comprises a loop guide structure including a diverging switch having an output which is connected to a domain destruction element and also a domain splitter, one output of which closes the loop guide structure, another output thereof constituting the output of the domain splitting device. A domain can thus pass through the loop under the control of the rotary magnetic field and be repeatedly split. The domain can be destroyed by operation of the said diverging switch, with the result that the loop no longer contains a domain. This is also applicable if the loop can contain a plurality of domains.

The said other output is preferably connected to a further diverging switch, the output of which are connected to a domain destruction element and to an input of a storage structure. By operation of the further diverging switch, the information can thus be added to the train of domains formed, for example, in that the domains in the domain locations containing the information "0" are removed.

The domain generating device is preferably capable of generating a domain per plate under the control of the rotary magnetic field. Such a domain generating device is known per se, but combination with the described aspects results in a storage device which consists of a plurality of plates and which is selectively controllable per plate and which comprises only passive components per plate. Other known domain generating devices comprise current loops which are provided on the plate. This gives rise to problems, notably in the case of small domain dimensions.

The said input structure preferably comprises a number of parallel-connected diverging switches and converging switches. The writing of a word is thus accelerated in that a shorter sequence of the rotary magnetic field is required for writing in an information word which is specific for the said plate.

The said output structure preferably comprises a parallel-connection of a number of diverging switches and converging switches. The erasing is thus accelerated in a corresponding manner.

A domain is preferably controllable as desired per plate via the switching device by cooperation of a rotary magnetic field sequence and a locally present second domain. A switching device of this kind is known per se, but by combination with the further elements of the idea of the invention a multi-purpose device can thus be realized. For example, an accumulator circuit can thus be constructed using only passive elements.

The invention will be described in detail hereinafter with reference to the drawing.

Figure 1A:
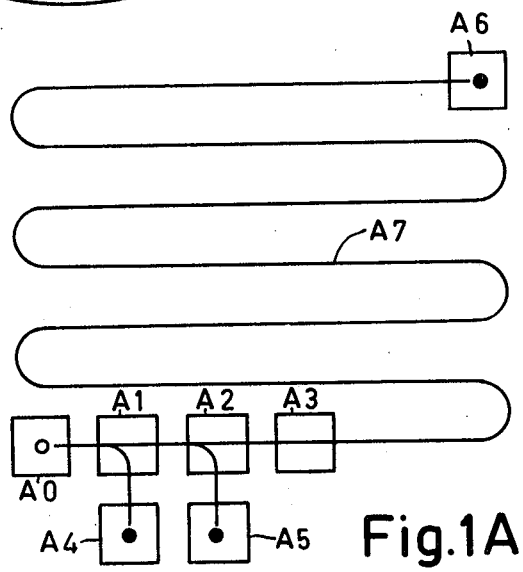
Figure 1:
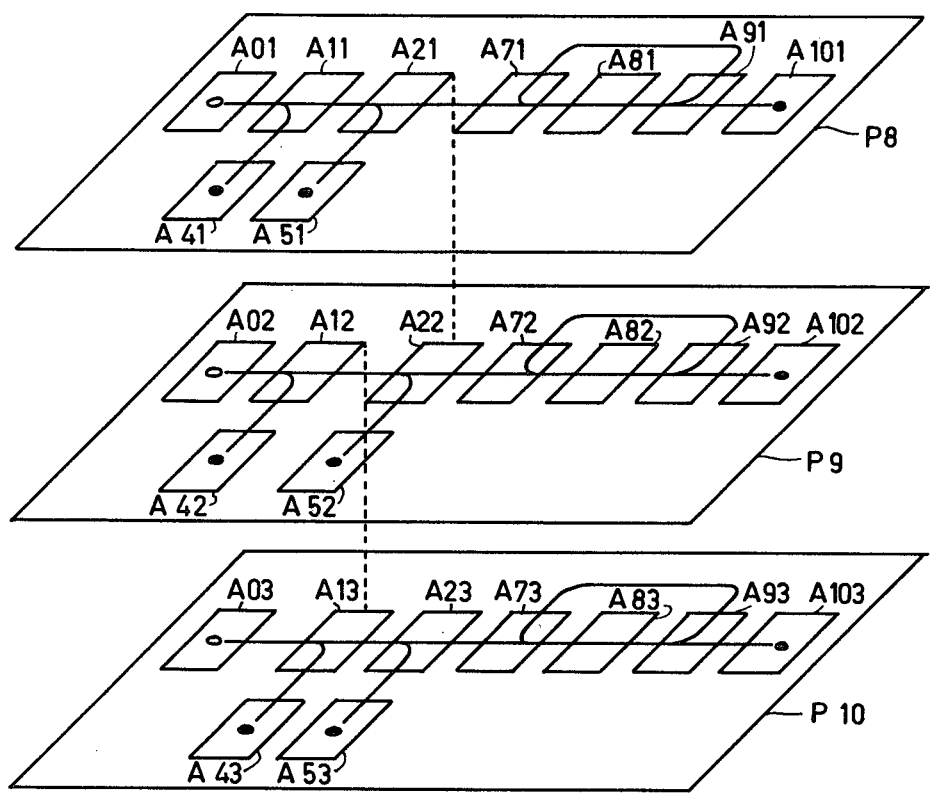
Figure 2:
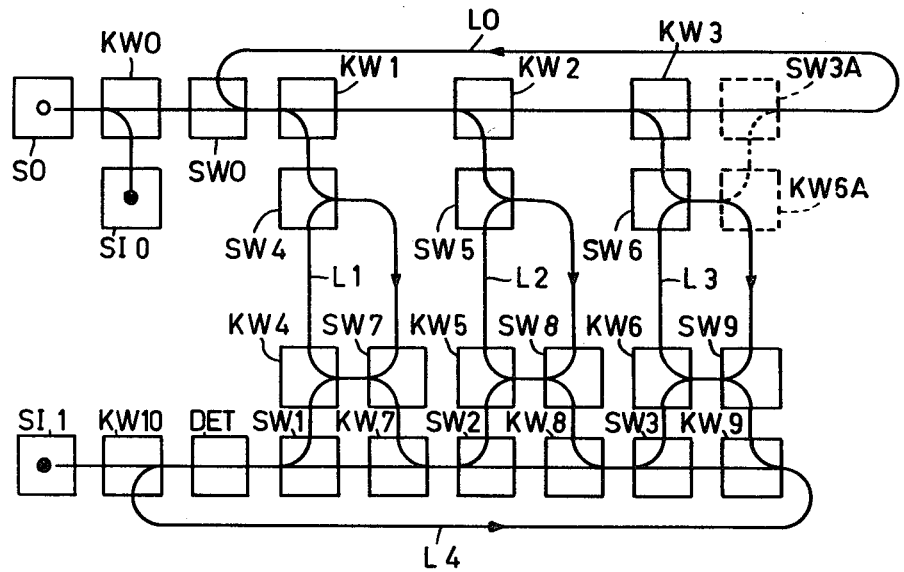
Figure 3:
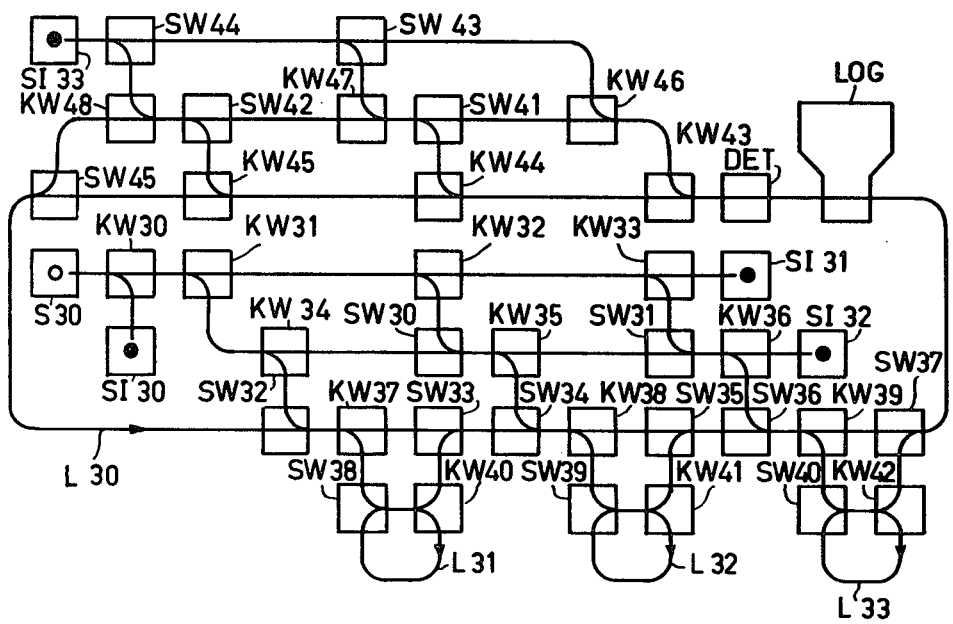
Figure 4:
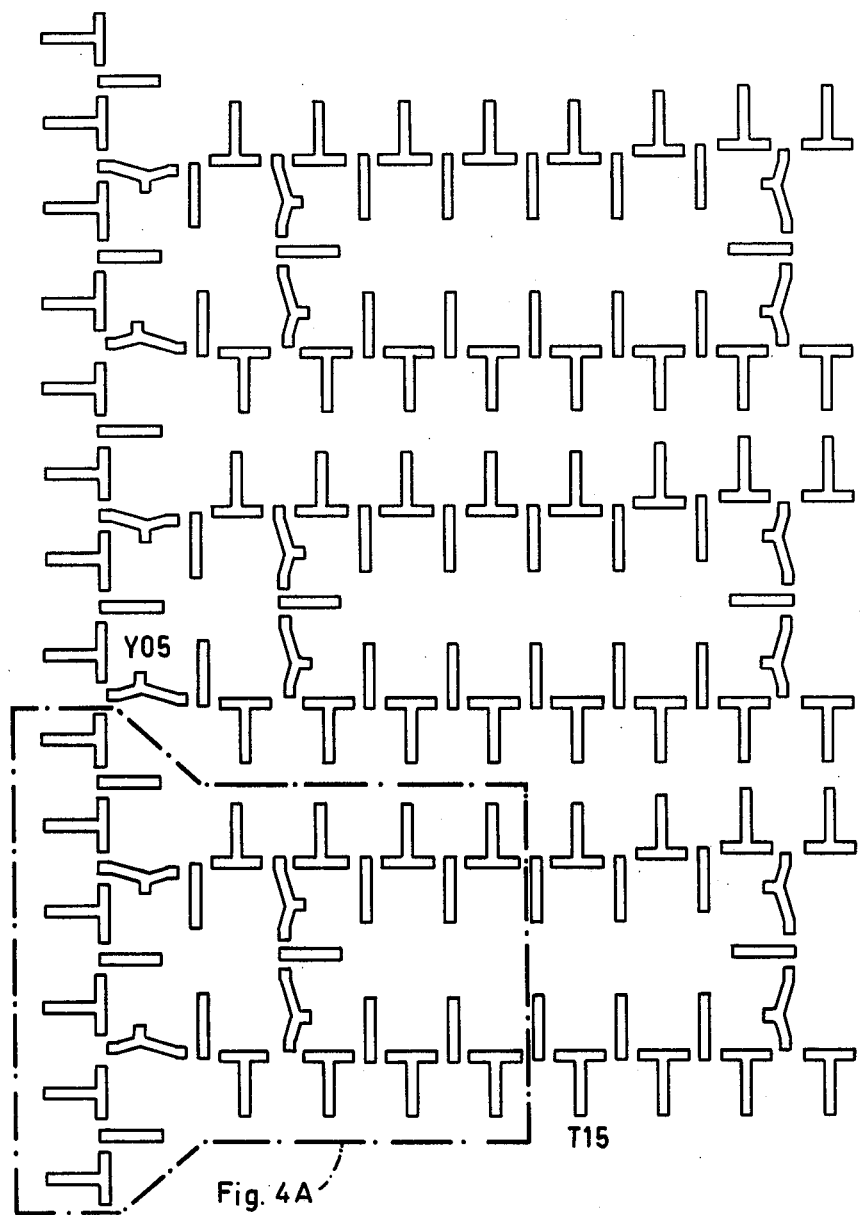
Figure 4A:
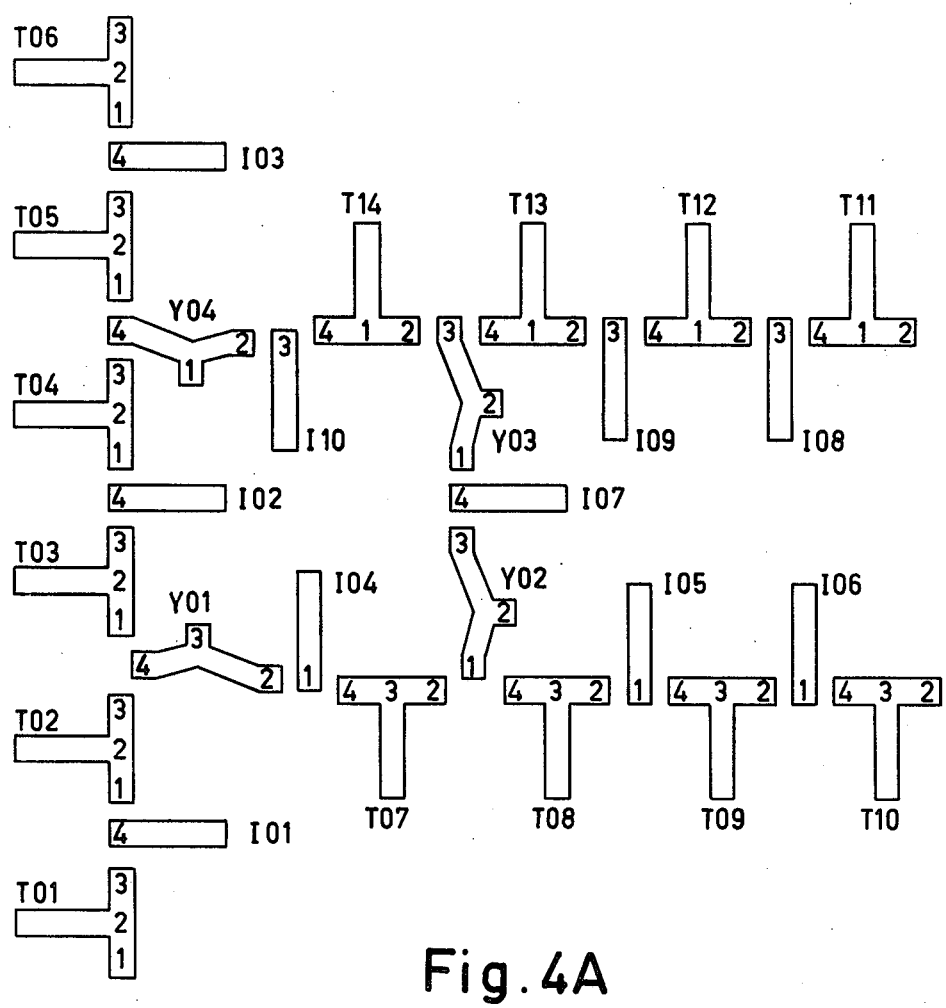
Figure 5:
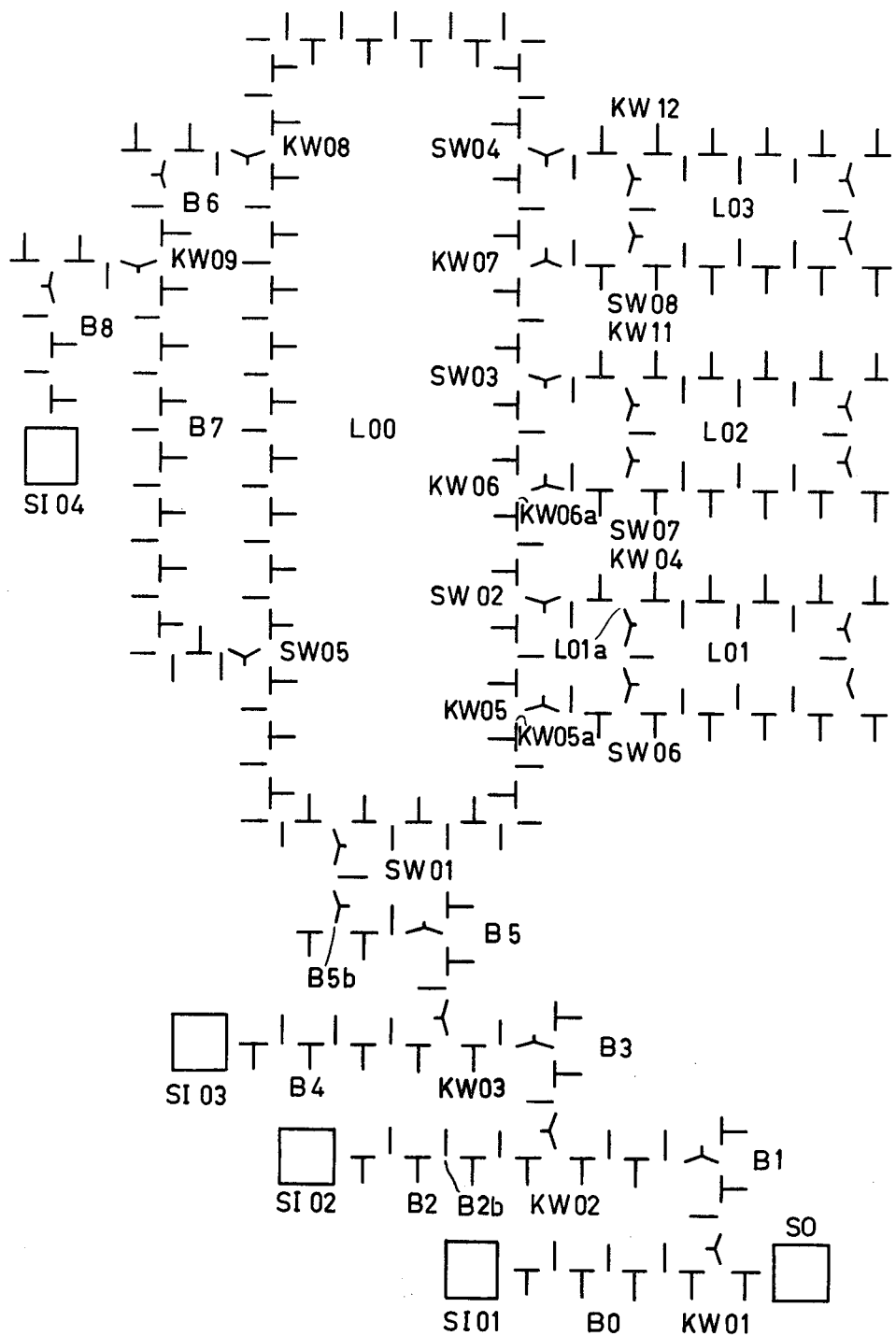
Figure 6:
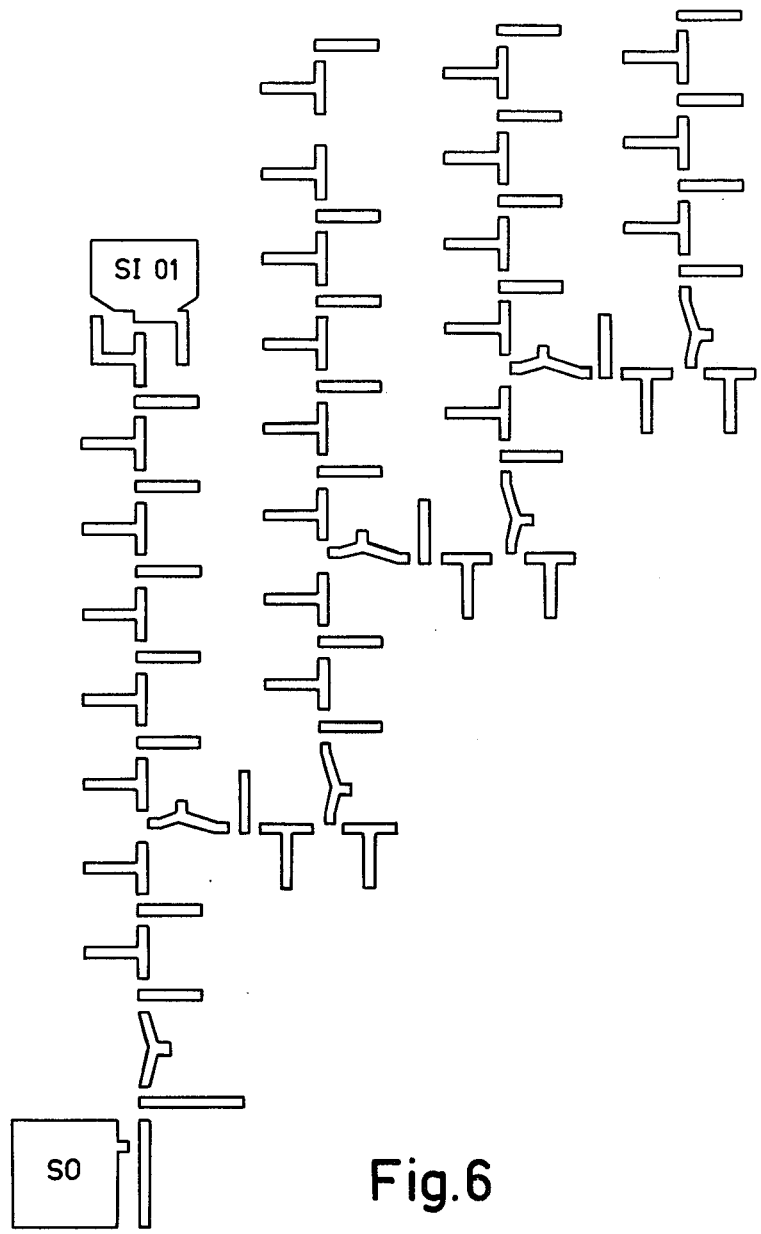
Figure 7:
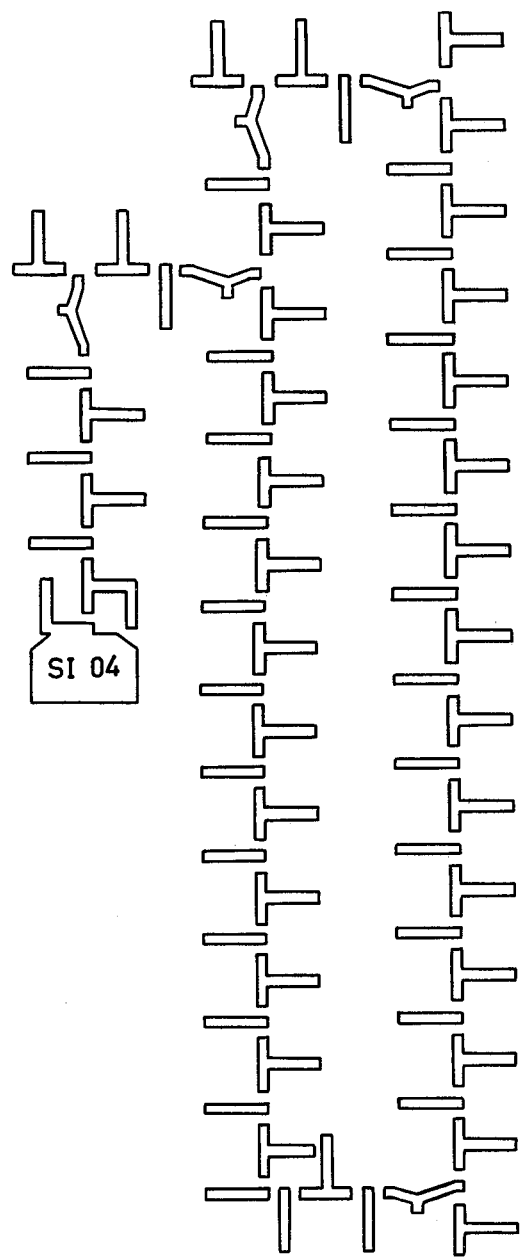
Figure 8:
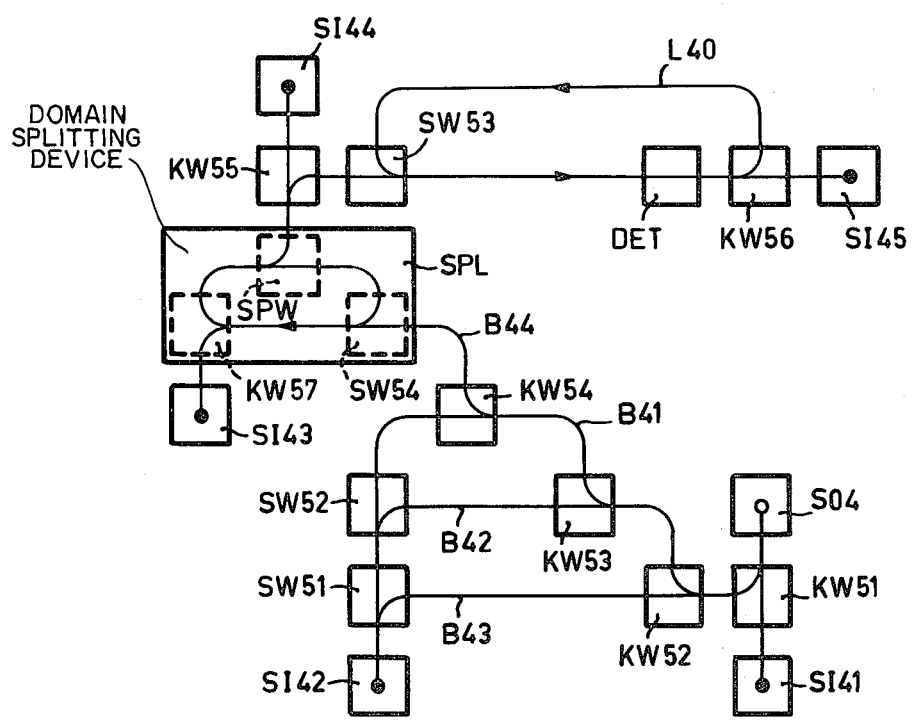
Figure 9:
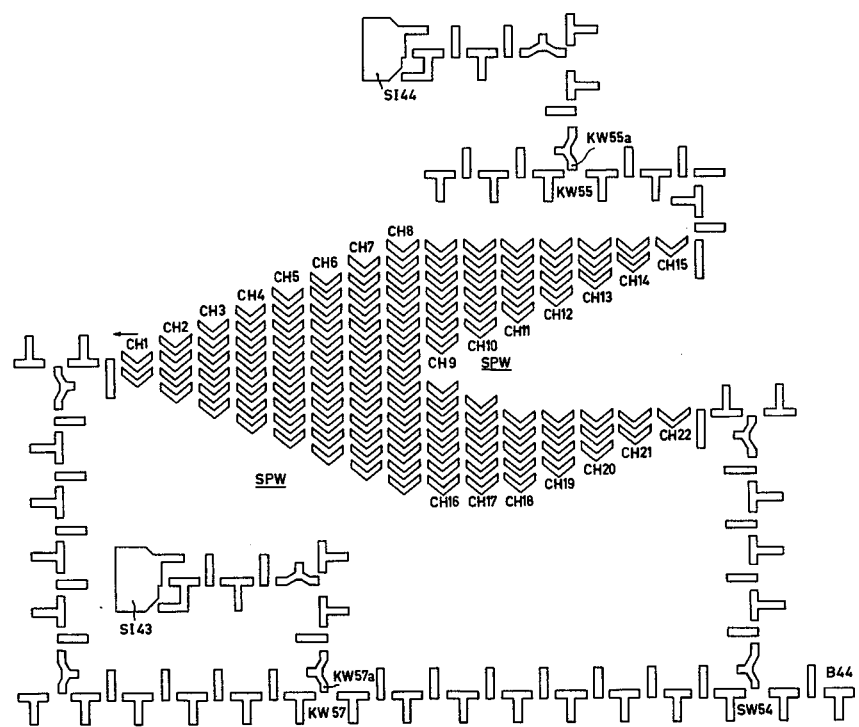
Figure 10:
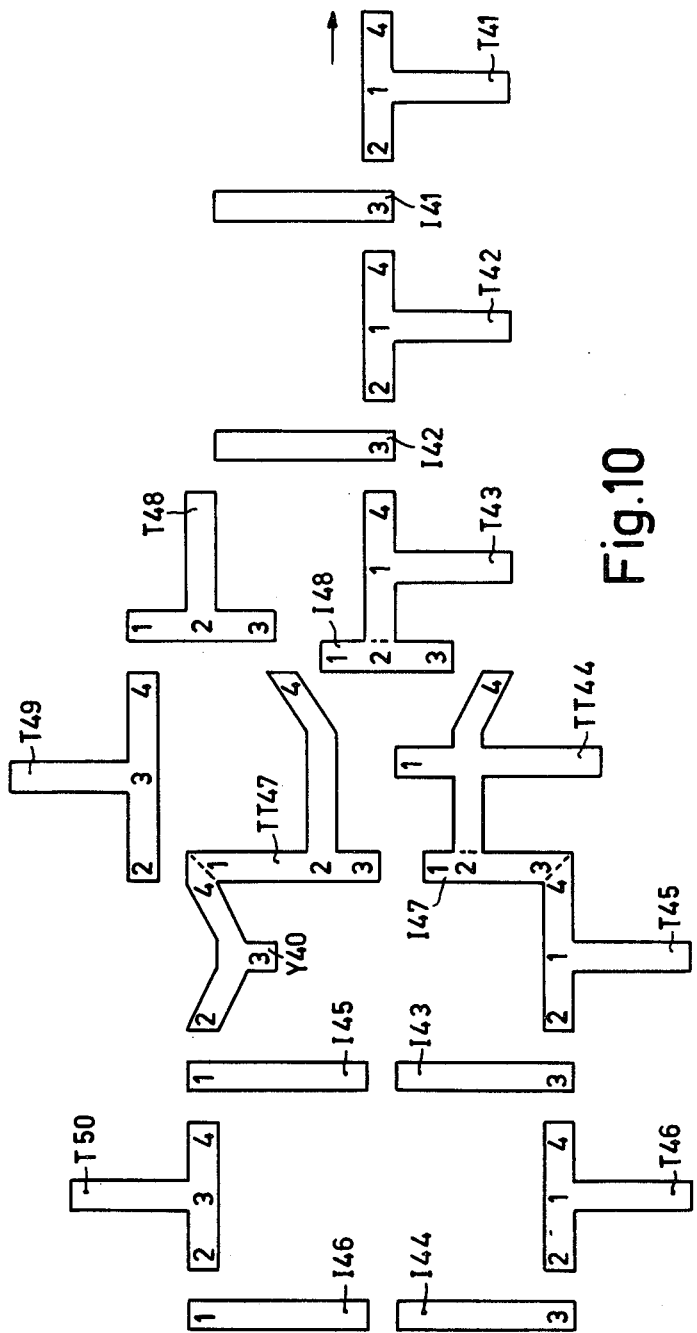

FIG. 1 shows a device according to the invention;
FIG. 1A is a view of functional elements present on a plate of magnetic material;
FIG. 1B is a further view thereof;
FIG. 2 is a subsequent view thereof;
FIG. 3 is a subsequent view thereof;
FIGS. 4 and 4A show a diagram of a storage loop structure comprising diverging switches and converging switches;
FIG. 5 shows a diagram of a storage device according to the invention;
FIG. 6 shows an input structure according to the invention;
FIG. 7 shows an output structure according to the invention;
FIG. 8 shows a further view of functional elements present on a plate of magnetic material according to the invention;
FIG. 9 shows an embodiment of a domain splitting device;
FIG. 10 shows a second embodiment of a domain splitting device.

FIG. 1 shows a device according to the invention, comprising an information input terminal K1, a control unit CTR, two rotary field generators DRI 1, 2, two Helmholtz coils C 1, C 2, seven plates of magnetic material P 1 . . . 7, a read amplifier device SA, and an information output terminal K2. Also present but not shown are a main magnetic field generator and a second pair of Helmholtz coils which are orientated transverse to the first pair. The main magnetic field generator may be permanent magnet, the field of which is directed transverse to the plates P 1 . . . 7.

Information can be received on terminal K1. The information can contain command signals such as "read" or "write". The information can furthermore contain the address of one or more of the plates P 1 . . . 7. Finally, the information can contain data signals whereby the stored information can be modified. The information received on terminal K1 is processed in the control unit CTR so as to form control signals. The unit CTR can comprise, for example, a parity detector, a parity generator, an address extraction device, a counter, for the case where, for example, a number of successive words are addressed, a decoder, a read-only store, and registers. All these elements are known per se. The control device applies control signals to the rotary field generators DRI 1, 2. The rotary field generator DRI 1 applies current pulses to the two Helmholtz coils C 1, C 2, so that a magnetic field component is generated parallel to the side of the plates P 1 . . . 7, shown in perspective. Helmholtz coils produce a substantially homogeneous field at the area of their centre near the axis of rotation. It is known to generate homogeneous fields using other coils such as spherical coils. Two Helmholtz coils which are not shown can similarly generate a homogeneous field which is parallel to the plane of the drawing and the plates of magnetic material P 1 . . . 7. (The construction of the plates will be described hereinafter). Magnetic fields can be generated in all directions in the plane of the plates P 1 . . . 7 by co-operation of the four Helmholtz coils. As a result, the domains can be transported along the domain guide structures provided on the plates P 1 . . . 7. The plates comprise detection elements which are connected to the read amplifier device SA via detection lines. This amplifier applies the amplified read signals to terminal K2. The detection need not be performed in the plate. Optical detection methods are known in which use is made of the fact that the plate of magnetic material can be substantially transparent. When linearly polarized light is transmitted through the plate, the rotation of the polarization plane is dependent on the presence of a domain. It is known to detect such a domain, for example, by a device which is common to all plates. The plates can separately comprise a destruction element for domains. It is alternatively possible for all plates to have a combined domain destruction device. If the main magnetic field is increased beyond the collapse field, all domains are destroyed.

FIG. 1A is a view of functional elements present on a plate of magnetic material, comprising a source of magnetic domains A0, two diverging switches A1, A2, a detector A3, a domain destruction element A6, and two domain destruction elements A4, A5. In each period of the rotary magnetic field the source A0 produces a domain which is applied to the diverging switch A1 under the influence of the rotary magnetic field. In a first position of this diverging switch, the domain is applied to the domain destruction element A4. In a second position of this diverging switch, the domain is applied to the diverging switch A2. In a first position of the diverging switch A2, the relevant domain is applied to the domain destruction element A5. In a second position of the diverging switch A2, the relevant domain reaches the detector A3 and the storage structure A7 which has a meandered shape. The discrete elements of the domain guide structure are not shown. The operation of the switches will be discussed hereinafter. When the domains have been stored in the structure A7 and the rotation of the rotary magnetic field is directed forwards, the domains serially arrive at the domain destruction element A6 which can also comprise a detector. If the rotation is directed backwards, the domains are detected by the element A3. When the source generates domains, they can be destroyed or stored. The spacing of the possible domains on the storage structure is constant. Therefore, an absent (destroyed) domain can represent a binary "0"; a domain present can be a binary "1".

FIG. 1B is a perspective view of functional elements provided on a plate of magnetic material. Three plates P 8, 9, 10 are shown for the sake of clarity. Each plate comprises a source of magnetic domains A01 . . . A0 3, two diverging switches A11 . . . A13, 21 . . . 23, and two domain destruction elements A41 . . . 43, 51 . . . 53. So far the plates correspond to FIG. 1A. Each plate furthermore comprises a diverging switch A91 . . . 93, a converging switch A71 . . . 73, a detection element A81 . . . 83 and a further domain destruction element A101 . . . 103. The operation of the input structure is as described with reference to FIG. 1A. Via the converging switch A71 . . . 73, domains arrive on a single storage loop structure. When the diverging switch A91 . . . 93 is in a first position, domains arrive at a domain destruction element A101 . . . 103. When the diverging switch A91 . . . 93 is in a second position, they arrive at the converging switch A71 . . . 73 again via the storage structure. The domain guide structures correspond functionally and geometrically, with the exception of the arrangement of the diverging switches A21 and A13 which have been shifted with respect to the diverging switches A22, 23 and A11, 12, respectively. Due to this shift, for example, the diverging switch A13 can be in the first position and the diverging switches A11, 12 in the second position when the domain generating devices A01 . . . 03 simultaneously generate a domain. This is because it takes a longer period of time before the diverging switch A13 is reached, because this switch is situated further from the domain generating element. The operation of the diverging switches will be described in detail. A two-level specific input code is thus obtained because of the pairs of diverging switches which are arranged to branch out. As a result, the information stored per plate in the storage loop structure may be different. The plates P8 . . . 10 can be shifted in their plane; alternatively, a plurality of plates can be arranged in the same plane. In addition to the corresponding elements, they may also comprise non-corresponding elements, for example, if the function of one of the plates differs from that of the others. It is furthermore possible for these plates to have different orientations in that they are rotated with respect to each other while remaining in their original plate.

FIG. 2 gives another view of functional elements provided on a plate of magnetic material, comprising a source of magnetic domains SO, eleven diverging switches KWO . . . 10, ten converging switches SWO . . . 9, a detector DET, five loops LO . . . 4, and two domain destruction elements SIO, 1. In each period of the rotary magnetic field, the source SO produces a domain which is applied to the diverging switch KWO under the influence of the rotary magnetic field. In a first position of this diverging switch, the domain is applied to the domain destruction element SIO. In a second position of this diverging switch, the domain reaches the write loop LO via the converging switch SWO. When the diverging switch KW1 is in a first position, the domain reaches the storage loop L1 via the converging switch SW4. When the diverging switch KW1 is in a second position, the domain remains in the write loop LO. When the diverging switch KW4 is in a first position, the domain remain on the storage loop Lw. When the diverging switch KW4 is in a second position, the domain is applied to the converging switch SW1 and reaches the read loop L4. After having circulated through the read loop L4, the relevant domain can be applied to the storage loop L1 again via the diverging switch KW7 and the converging switch SW7. The same applies with regard to the storage loops L2, 3. When the domain passes the detector DET, the latter can supply a signal, with the result that the information can be used elsewhere. When the diverging switch KW10 is in a first position, passing domains are applied to the domain destruction element SI1 and the relevant information is erased. When the diverging switch KW10 is in a second position, the domains remain in the read loop L4 and can be stored again in a storage loop. The switches KW6A and SW3A are denoted by broken lines: these two switches can replace the switches KW6 and SW3, respectively. In that case the loop L0 also acts as a read loop, provided a detector is connected thereto. The loop L4 can then be dispensed with, so that in FIG. 2 six switches could be saved. The diverging switch KW1 is shown to be different from the diverging switch LW4. This was done to obtain a simple set-up of the Figure. The same applies to the converging switches. Different types of diverging switch and converging switch can be used simultaneously. Within the framework of FIG. 2, various organizations are possible. The diverging switch KWO can control the coding of the information. The diverging switches KW1 . . . 3 can be controlled together, with the result that in each of the storage loops L1 . . . 3 one bit of an information word consisting of three bits can be simultaneously introduced. The same is applicable to reading. The writing of a word in the loop L0 can be temporarily interrupted if a word in the loop L4 must be quickly read. This is because it will appear that the writing of a word requires a comparatively large amount of time. In this embodiment there are five sets of diverging switches, i.e. KW0; KW1-3; KW4-6; KW7-9; KW10. In given cases each set is separately controllable. According to a simplet set-up only four sets are individually controllable; each set is then controlled on the basis of an orientation direction of the rotary magnetic field according to one of the four major directions. In that case two suitable sets of said five sets can be controlled together, for example, the sets KW1-3 and KW7-9. The loops L0 and L4 have the same length.

FIG. 3 gives a further view of functional elements provided on a plate of magnetic material, comprising a source of magnetic domains S30, nineteen diverging switches KW30 . . . 48, sixteen converging switches Sw30 . . . 45, four domain destruction elements SI30 . . . 33, a detector DET, a logic structure LOG and four loops L30 . . . 33. The organization comprises a single combined write and read loop L30, comprising three parallel storage loops. The writing into and the erasing from the main loop L30 are also effected in parallel. Writing takes plate in three steps. Because of the position of the diverging switch KW30, the information is modulated and the domains are subsequently transported until they all reach an input position of the diverging switches KW31 . . . 33. These switches may be controlled or non-controlled, and the same applies at the next level for the diverging switches KW34-36. After having been read, the information can be applied in the same manner, via diverging switches KW43 . . . 45 and KW46 . . . 48 which are arranged in two levels, to the domain destruction element SI33. This multi-level organization can also be used in FIG. 2. The object thereof will be described in detail hereinafter. The parallel arrangement of diverging switches provides acceleration.

FIG. 3 furthermore comprises a logic structure LOG. Such a structure is known, for example, from an article by Sandfort and Burke, 1971, Intermag Conference Proceedings. This article describes combined diverging switches and converging switches, the operation of which depends on the information contents of the two input structures. The logic structure LOG per se can comprise a structure such as represented by the remainder of FIG. 3. The logic structure LOG can then be separately controlled. For example, an attractive accumulator can thus be formed.

FIG. 4 shows a storage structure comprising diverging switches and converging switches; FIG. 4A shows a part thereof and an increased scale. The discrete elements of the domain guide structure may consist of vapour-deposited permalloy, and may be shaped as a T (for example, T01 . . . 15), an I (for example, I01 . . . 10) or a Y (for example YO1 . . . 05). The T-elements can have four orientations; only three thereof are shown. The I-elements can have four orientations, because one end is situated near the axis of the domain guide structure while the other end is not. The a-symmetrical Y-elements have eight possible orientations, six of which are shown. The domains on the permalloy may tend to move in the direction of the rotary magnetic field. If this field is directed downwards in the plane of the drawing, a domain is present, for example, in position 1 of element T01. (Notation T011). If the field rotates counter-clockwise, the domain moves to position 2 on T-element T01: notation T012. If the field rotates upwards in the plane of the drawing, the domain changes over to position T013, and if the field rotates counter-clockwise, the domain jumps to position I014 (position 4 on element I01). During a second rotation, the domain moves to the positions T021, T022, T023, Y0 14. The element Y01 forms part of a diverging switch (for example, KW1 in FIG. 2). If the field continues to rotate counter-clockwise, the diverging switch at Y01 is in the position "straight forward", and the said domain proceeds via the positions T031, T032, T033 . . . .

If the direction of rotation of the rotary magnetic field reverses, the movement direction of the domain also changes: it then proceeds, for example, from position T022, via position T021 . . . , to position T011. If the position Y014 is passed during the return movement, the next position will be Y013 and not T023, because the former is nearer. This "nearness" need not be a property of the geometry, but is co-determined by the magnetic properties of the permalloy. In this case the next positions are Y013, Y012 . . . Y021, the rotary magnetic field thus being turned back over 7/4 periods. If the rotary magnetic field subsequently starts to rotate counter-clockwise again, the next positions are Y022, Y023 . . . When the domain arrives at position Y033 and the direction of rotation of the rotary magnetic field remains counter-clockwise the next position will be T134. If the direction of rotation is clockwise, the next position will T142 rather than Y032, because the former is "nearer". If the direction of rotation remains clockwise, the next positions are T141 . . . Y044, T043, T042 . . . . When position Y044 is reached, and the direction of rotation becomes counter-clockwise again, the next position will be T051, T052, . . . T063. When position Y044 is passed T043, T042 . . . ) and position Y021 has not yet been reached (via T03, Y01, etc) — this would require 15/4 periods — and the direction of rotation becomes counter-clockwise again, the domain returns via the same path and further via the positions T051, 052 . . . T063. In accordance with the foregoing, the elements Y01, 03 and their surroundings act as diverging switches, and the elements Y02, 04 and their surroundings as converging switches. If the direction of rotation of the rotary magnetic field reverses during 7/4 periods between the positions Y014 and Y021 and between the positions Y033 and Y044, domains are transferred between the paths T01 . . . 06 and T10,09.08.I07,T13,12,11. If the reversal does not occur, this does not occur either, nor does it occur if the reversal occurs during less than 7/4 periods. It does not occur either if a domain is not exactly present in one of said starting positions. The starting positions can be occupied when the rotary magnetic field is directed upwards (position Y014), or to the right (position Y033), respectively. If the direction of rotation is reversed exactly for 7/4 periods, both diverging switches can be separately adjusted if the starting position of the rotary magnetic field is directed to the left and upwards, respectively. The diverging switches can be simultaneously operated. In that case, the initial position of the rotary magnetic field is directed to the left. The direction of rotation is then reversed for 8/4 periods, and is normal for 8/4 periods. Assume that all locations in the storage loop are occupied (T154, T104, T094, T084, I074, T134, T124, T114 etc.), and also Y014. After two counter-clockwise periods, all locations in the loop will be occupied by domains which were all stored in the loop, except for: position I074 is vacant and position T084 is occupied by the domain arriving from position Y014. Also occupied are Y044 and T144. After one period in the forward direction, position T134 has been filled by the domain originating from T144, the domain of Y044 moves to I034, and the domains in the storage loop are shifted one period. After a final period of forwards rotation, the domains will be situated on the starting positions: the position T134 is then occupied by the newly added domain, and on position Y054 a domain of the storage loop has been exchanged. Four periods of the rotary magnetic field are thus required for combined operation of two diverging switches. If they are operated separately, this would require at least 4 × 7/4 is 7 periods of the rotary magnetic field.

In the configuration of the discrete elements shown, the diverging switches are activated according to one of the four directions of the magnetic field. Each of the four types of diverging switch can be separately operated, as long as the part of the domain guide structure passed through under the influence of the reverse rotation of the rotary magnetic field cannot also be passed through under the influence of the reversed rotary magnetic field rotation used for controlling another type of diverging switch. It was demonstrated in the foregoing that the simultaneous operation of different types of switch can be advantageous in given cases.

The diverging switches of FIG. 4 can be changed over by reverse rotation of the rotary magnetic field over 7/4 periods. It is possible per se to design diverging switches which are changed over in the case of a reverse rotation over a number of periods, for example, 2, 3/4 or 11/4 periods. This number need not necessarily be the same for all diverging switches of the storage device.

FIG. 5 shows a general diagram of a storage device according to the invention, organized in accordance with FIG. 2 and comprising a combined write/read loop. There are provided a source S0, eleven diverging switches KW01 . . . 09, 11, 12, eight converging switches SW01 . . . 08, four loops L00 . . . 03, nine path structures Bo . . . 8, and four domain destruction elements SI01 . . . 04. The diverging switches are divided into four groups in accordance with their orientation: KW01,02,03; KW05,06,07; KW04,11,12; KW08,09.

The normal sense of rotation of the rotary magnetic field is counter-clockwise. During each period of the rotary magnetic field the source S0 produces a domain by splitting a so-termed "pilot flame" domain, while the split off domain is carried off. If no further control were provided, split off domains arrive at the domain destruction element SI01 situated at the end of path B0. When a domain arrives at the diverging switch KW01 and the rotation of the rotary magnetic field reverses for 7/4 periods, assuming a rotary magnetic field which is directed downwards, the domain proceeds along path B1: the first part of path B1 has a reverse structure. After 11/4 counter-clockwise periods of the rotary magnetic field, the deflected domain arrives at the diverging switch KW02. After 7/4 periods of reverse rotation and 7/4 periods of normal rotation, the deflected domain arrives at diverging switch KW03. After another 7/4 periods of reverse rotation, it can be transported further via path B5. The three diverging switches KW01 . . . 03 can generate the information and apply the information-carrying domains specifically for this configuration to path B5, loop L00 and the storage loops L01 . . . 03. KW01 then generates the information, and KW02,03 constitutes a "source lock".

The specific code of the path structure shown (source lock) can be written as "1-0". This means: in order to travel from diverging switch KW01 to KW02, thus one period of the rotary magnetic field in the normal sense is required. So 7/4 periods of reverse rotation and 11/4 periods of normal rotation. This amounts to zero periods between the diverging switches KW02 and KW03, because this concerns 7/4 periods of reverse rotation and 7/4 periods of normal rotation. A source lock formed by two diverging switches is capable of forming many specific codes, such as 0-0, 0-1, 0-2, 1-0, 1-1, 1-2 . . . ; this does not concern a binary code. When more diverging switches are used in series, the number of possibilities is increased without the input structure being substantially enlarged. The information is formed as follows: if the rotary field sequence is 7/4 periods backwards, 11/4 periods forwards, 7/4 backwards etc., all domains are deflected at the diverging switch KW01 if the start is made in the correct rotary magnetic field position (directed downwards). If the sequence is $-7/4 +15/4 -7/4 +15/4 \ldots$, each second domain is deflected. Other fractions of the domains can similarly be deflected, for example, each fourth domain: $-7/4 + 23/4 \ldots$. A logic "0" can be produced by suppressing $-7/4$ and $+ 7/4$ periods: the domain then travels straight forward; suppression in the sequence $-7/4 + 11/4 - 7/4 + 11/4 \ldots$ then produces: $-7/4 + 11/4 - + 4/4 - 7/4 + 11/4 \ldots$, which is: $-7/4 + 15/4 - 7/4 + 11/4$. When suppression is omitted, a logic "1" is formed. Thus, an information word can be serially formed comprising, for example, three bits which are separated by three informationless periods of the domain guide structure.

In the foregoing only the diverging switch KW01 was considered. For the entire lock and a word consisting exclusively of "ones", the procedure is as follows.

a. 7/4 periods backwards, 11/4 periods forwards $(-7/4 + 11/4)$. The first domain is then at the diverging switch KW02, the second at KW01, but this does not represent information.

b. (−7/4 + 7/4): the first domain is at diverging switch KW03, the others have returned to their starting point, with the exception of the domain which was at diverging switch KW01: this domain is situated one period of the domain guide structure before the diverging switch KW02.

c. (−7/4 + 7/4): the first domain has arrived at element B5b, the others have not been displaced.

d. (+ 12/4): the next domain, i.e. the next domain containing information arrives at diverging switch K01; the first deflected domain proceeds to the main loop via the converging switch SW01; the second deflected domain proceeds to element B2b, and will not return under the specific input code used.

Assume that a further plate which is controlled by the same rotary field sequence has the specific code 0-0. As a result of the above sequence a, the first domain is deflected but is driven one period of the domain guide structure beyond the diverging switch corresponding to KW02. Reverse rotation now takes place during 7/4 periods, but this is always followed by at least 7/4 periods of forward rotation. This domain can never be deflected a second time, so not at diverging switch KW02.

However, in the case of a write operation in the plate having the specific code 0-0, the domains in FIG. 5 will reach the diverging switch KW02 only during the sequence d. and they will not be deflected.

There are two degrees of freedom in the arrangement of the diverging switches KW02 and KW03. There is also a degree of freedom in the diverging switch KW01, but this cannot be utilized in the above example, because the source S0 splits off a domain in each counter-clockwise period of the rotary magnetic field.

The structure of FIG. 5 can allow passage to the proper domains, for example, each fourth domain, under the control of other rotary field sequences. In FIG. 1 the specific codes and the rotary field sequences must be chosen for the plates P1 . . . 7 such that each plate has a specific rotary field sequence. There are inadmissable sequences which would cause too many domains to be deflected and applied to path B5. There are configurations of diverging switches for which no sequence is admissable having only three informationless locations between successive information bits. These configurations can usually be used if there are a different number of vacant locations between two successive information bits, for example, seven.

In the present example the information is formed by the position of KW01. This may also be an other diverging switch. It is possible to use a diverging switch which is controlled on the basis of a different rotary magnetic field position, for example, on the basis of a rotary magnetic field directed to the right such as the diverging switch KW08 yet be described. This is possible if erasing and writing do not simultaneously occur.

In FIG. 5 the surplus of forward rotation of the sequence is 1 period. If this is more than four, a sequence is cancelled because otherwise the spacing between successive information bits becomes larger than four periods of the domain guide structure, while the latter is exactly the interval between the successive storage loops L01 . . . 03. In given configurations the selection of the domains can be overlapping, in that the second information-containing domain is already deflected before the first information-containing domain has passed the last diverging switch of the input structure. The input structure may comprise an arbitrary number of diverging switches of different orientation with respect to each other. It is not necessary either that each switch is operated by 7/4 periods of clockwise rotation; this may also be, for example, 3/4 or 11/4 periods, while the switches differ from each other in this respect. It is also possible that a diverging switch produces a deficiency instead of a surplus of forward rotation.

The shape of the Y-elements is shown in FIG. 4. The source SO FIG. 5) and the domain destruction elements SI01 . . . 04 are known per se. Other diverging switches and converging switches are also known. The deflected domains reach, via the converging switch SW01, the main loop L00. If the word to be written contains three bits which are each time separated by three informationless periods of the domain guide structure, they simultaneously arrive at the diverging switches KWO5 . . . 07 and are deflected so as to be stored in the loop paths L01 . . . 03.

The information can be addressed by activating the diverging switches KW10 . . . 12 as described with reference to FIG. 4. The loops L01 . . . 03 can each contain 11 bits of information. This number has been chosen to be small for clarity's sake. The main loop L00 comprises 37 positions in which in principle each time one information bit can be present. If an information bit, for example, a domain is present in the location L01a, it is advanced to the location KW06a by a sequence of −7/4 + 7/4 periods of the rotary magnetic field. It reaches the location of KW05a in 33 periods. After a sequence of +1/4 − 7/4 + 6/4 periods, it is back in the location L01a again. The total saldo is 33 forward periods, in which the information in the storage loops has circulated three times. Provided between SW04 and KW04 and is a detector which is not shown. Therefore, in the given organization the following is applicable to the length of the main loop (N) and the auxiliary loop (n) : $N = j.n + 4$, j being a natural number. According to another organization, the auxiliary loops are longer. If a word passes through the main loop twice in succession, it may have been displaced over four periods in the auxiliary loops.

The reading of the words from the auxiliary loops is effected in the parallel mode. It is subsequently possible to read other words in the intervals between the bits read. This can notably be effected when a number of successive words are read which are successively arranged in the auxiliary loops L01 . . . 03.

The switches KWO8, 09, SW05 and the associated domain guide structure constitute an output structure. Each of the two diverging switches offers a degree of freedom for erasing a word. If they can each have four positions, sixteen different specific codes can be formed. The configuration is merely given by way of example. Domains which are not deflected to SI04 reach the converging switch SW05 directly or via path B7. The sum of the number of forward periods of the rotary magnetic field is the same along both paths, because a correction is made for the number of periods of backwards rotation along path B7 (−7/4 periods). As a result, the domains deflected along path B7 return to their original location between the domains not deflected along B7.

The store shown comprises diverging switches in four orientations. This number can in principle be different in other structures. The advantage of the invention, however, is that the generation of the rotary fields is simple. Each time one word can be read per plate. It is also possible to store one bit of a word per plate.

Such a store operates with 5 ηm domains on a plate of $Y_{2.85}La_{0.15}Fe_{3.80}Ga_{1.20}O_{12}$ at a frequency of 25 kHz. In the case of 32 parallel-connected plates, the read speed is $32 \times 25,000 = 800$ kbits per second. In the case of 64 storage loops of 64 bits, the access time to an arbitrary bit location amounts to approximately 32 periods for bringing the relevant information to the "frontmast" location of the storage loop, 3½ periods for operating the read diverging switches, $32 \times 4 = 128$ periods for bringing the information from the central loop to the output, so in total approximately 6½ ms. An organization 32 loops of 128 bits offers a shorter mean read time, i.e. approximately 5.3 ms. The write time of a word depends on the number of diverging switches forming the specific input code. If this number is 6 plus one information-forming diverging switch, at least $7 \times (7/2) = 24½$ periods are required for writing in one bit, so about 1 ms. For a word comprising 64 bits, this will then be in the order of 50 ms. Therefore, the store can notably be used for information which, after having been written, is read several times, for example, ten times.

FIG. 6 shows an input structure and FIG. 7 shows an output structure according to the principles of FIG. 5, and these Figures will not be further discussed herein.

In FIG. 5 the four possible orientations of the diverging switches are used for information writing, storage, reading and erasing, for example, KW01, KW05, KW04 and KW08, respectively. There are also further possibilities. For example, for the insertion of an information bit in the storage loops and the extraction therefrom, a diverging switch of the same orientations can be used, provided that the vacant location formed is in phase with the information bit to be inserted (see for example, the description with reference to FIG. 4). There are other ways of storage possible. For example, the storage loop structure may comprise three levels: sub-loops are then connected to the loops L01 . . . 03 in the same manner as the loops L01 . . . 03 are connected to the main loop L00.

If writing and reading never occur simultaneously one of the four diverging switch orientations can be used in a different manner. In that case it is also possible to use a domain guide structure in which only three diverging switch orientations are possible. Sometimes given tolerances can then be less narrow, for example, as regards the thickness of the layer of permalloy or as regards the values of the magnetic fields. The idea of the invention can also be incorporated in other devices.

Similar to the FIGS. 2, 3 of the principal application, FIG. 8 shows functional elements present on a plate of magnetic material, comprising a source of magnetic domains S04, six diverging switches KW51 . . . 56, three converging switches SW51 . . . 53. a detector DET, a loop L40, five domain destruction elements SI41 . . . 45, and a domain splitting device SPL incorporating a diverging switch KW57, a converging switch SW54, a splitting switch SPW, and a loop.

The main magnetic field generator, rotary magnetic field generator and the associated elements have been omitted for the sake of simplicity. In each period of the rotary magnetic field the source SO4 produces a domain which is applied, driven by the rotary magnetic field, to the diverging switch KW51. In a first position of the diverging switch KW51, the domain is applied to the domain destruction element SI41. In a second position of the diverging switch KW51, the domain is applied to the diverging switch KW 52. The diverging switch KW51 is operated by a rotary magnetic field sequence which differs from that which controls the diverging switches KW52 . . . 54 and which ensures that only one or only a few domains arrive at the diverging switch KW52 per plate. In a first position of diverging switch KW52, the domain is applied, via the path B42 and the converging switch SW51, to the domain destruction element SI42. In a second position of diverging switch KW52, the domain is applied to the diverging switch KW53. As already described before the diverging switches KW52 . . . 54 are capable of forming a specific input code. Via a path B44, a domain can be applied in a selected plate to the domain splitting device SPL. For a given direction of rotation of the rotary magnetic field, a domain then continuously circulates in the internal loop of the domain splitting device. In each circulation the converging switch SW54 and the diverging switch KW57 are passed. When it passes the splitting switch SPW, the domain is each time split in two parts; one part thereof continues to circulate in the loop, while the second part is applied to the diverging switch KW55 via path B45. Contrary to what was described in the principal application, information is added to the domain flow only by the diverging switch K55. The information-containing domains (ones) are applied, via the converging switch SW53, to the loop L40, while the other domains are applied to the domain destruction element SI44. At the completion of the writing of a word, the diverging switch KW57 is operated and any domains still present in the loop are applied to the domain destruction element SI43. According to this diagram, only the domain splitting device of the selected plate receives a domain. It is possible, per se, for example, to apply a domain in two plates to the domain splitting device, a correction then being made in one of the two. This is possible during the writing of two information words which differ only as regards a few bits. The correction can be effected by means of the diverging switch KW56 or another device to be specially provided. Furthermore, the arrangement of the diverging switch KW55 can form an additional specific code with the result that, for example, always four plates are simultaneously selected by the input structure (KW52 . . . 54) while in only one thereof information is written. The domain splitting device can contain one or more domains and possibly also a plurality of domain splitters having as many outputs to the storage loops. The diverging switch KW55 may also be of a multiple construction. The nature of the storage structure (loop L40) will not be elaborated herein.

FIG. 9 shows an example of a domain splitting device and its periphery. The elements B44, SW54, KW57, SI43, KW55 and SI44 are shown in FIG. 8, and their construction has been described before. Furthermore, there are provided 22 chevron strips CH1 . . . 22 which are made of for example, permalloy which is vapour-deposited on the plate of magnetic material. The normal direction of rotation of the rotary magnetic field is counter-clockwise; the domains then pass through the loop structure in the clockwise direction. When a domain reaches the chevron strip CH1 and the direction of the rotary magnetic field corresponds to the direction of the arrow, the domain is situated on the corresponding end of the chevron strip CH1. If the rotary magnetic field rotates counter-clockwise through 90°, the domain will be situated in the centre of the chevron strip CH1. After a further rotation through 90°, the domain will be situated on the second side of the chevron strip CH1, and after another 90° it will be situated on the facing parts of the chevron strips CH1 and 2. After another rotation through 90° the domain will have been displaced to the chevron strip CH2. After a number of periods of the rotary magnetic field, the domain reaches the chevron strip CH8 and, during the displacement in the longitudinal direction of the strip, it has spread: it each time occupies approximately the complete length of the strip. Upon a next rotation of the rotary magnetic field, the domain is split into two parts on the chevron strips CH9 and CH16, respectively, which are separated by an interruption. During further rotation, the two split-off domains are further transported and finally reach the chevron strips CH15 and CH22, respectively. The former constitutes the output of the domain splitting device; via the second strip, the domain again reaches the converging switch SW54. The diverging switches KW57, 55 are operated in that, assuming the presence of a domain in the positions KW57a and KW55a, respectively, the rotation of the rotary magnetic field is reversed over at least 7/4 periods, and subsequently becomes counter-clockwise again. In accordance with the Figure, the functional elements of the domain splitting device are separated according to location, with the result that the length of the loop is comparatively large: a domain circulates in forty periods of the rotary magnetic field. In accordance with a storage structure described before the domain locations of a word on the major loop are each time four periods of the domain guide structure removed from each other. It is favorable to fill the loop of FIG. 9 equidistantly with ten domains. In order to write a word of sixty bits, each domain then passes through the loop six times. The length of the loop can be reduced by using a larger gradient in the lengths of the chevron strips of the splitting switch. To this end, it is also possible to arrange the domain destruction element SI43 outside the loop. Furthermore, the second long side can also comprise a splitting switch. The two diverging switches shown are operated on the basis of the same orientation of the rotary magnetic field. It may then be advantageous that they are not situated a quadruple of periods of the domain guide structure apart, because in that case they do not simultaneously receive a domain.

FIG. 10 shows a second example of a domain splitting device, in which the functional elements spatially partly overlap each other. As a result, the circulating time of a domain in the loop is substantially reduced, so that less domains (possibly even only one) are sufficient for the fast writing of a word.

The device comprises discrete elements, for example, of permalloy which is vapour-deposited on the plate of magnetic material, i.e. the T-elements T41, 42, 43, 45, 46, 48, 49 and 50, eight I-elements I41 . . . 48, the Y-element Y40, and the hybrid elements TT44, 47. Some elements join each other without interruption. A splitting device used herein is known per se from an article by Hsu Chang et al. A self-contained magnet bubble domain memory chip, IEEE Transactions on magnetics, vol. MAG 8 (June 1972), pages 214–222, notable page 215. If the rotary magnetic field is orientated according to the arrow direction, a domain is, for example, in position T414. By a counter-clockwise rotation through 90°, it is transported to position T411 and upon further rotation to the positions T412 . . . T431: these constitute the input path. Further rotation through 90° transports the domain to position I482: this position represents the converging point of a converging switch. Continued rotation transports the domain to position I483: the direction of the rotary magnetic field is then directed downwards in the plane of the drawing. The next position is T444. After a further rotation through 90°, the domain is stretched and occupies both positions T441 and I471 which both constitute preferred positions and are situated so near to each other that the domain cannot be present in only one of these positions. After a further rotation through 90°, the domain occupies the positions TT472 and I472 which again constitute a preferred position, and following a further rotation through 90°, the domain occupies the positions TT473 and I473 for which the same is applicable. The domain is each time slightly further extended, in that the preferred positions are progressively spaced further apart. After a further rotation through 90°, a first preferred position arises on T454, the second on Y404, and the latter is so far removed from the former that the domain is split. Following the position T454, the next preferred positions are T451, T452, T433, T464 . . . I443. This series constitutes the output path of the domain splitting device. Following the position Y404, when the direction of rotation of the rotary magnetic field is counter-clockwise, the subsequent preferred positions are TT471, T492 (the latter is "energetically" nearer than position TT472 in which, however, the next domain to be split can already be present), T493, T494, T481, T482, T483, TT474, I481 and I482, so that the complete loop is completed in four periods of the rotary magnetic field. Four domains can be present in the loop. If a domain is present in position Y404 and the direction of rotation of the rotary magnetic field subsequently becomes clockwise, the next preferred positions are Y403, Y402, I451, I504 . . . I461. Therefore, the element Y40 thus incorporates a diverging switch having an output which may have a domain destruction element (not shown) connected thereto. A very compact domain splitting device is thus realized for use in a device according to the invention.

What is claimed is:

1. A magnetic domain storage device, comprising
at least two plates of magnetic material capable of maintaining magnetic domains therein;
a domain guide structure in each of said plates for guiding the transport of said magnetic domains therein, comprising a plurality of discrete elements, including an input structure, a storage structure, a domain generating device connected to said input structure, a domain destruction device, and a domain detecting device; said input structure including at least two series-connected diverging switches for altering the path of said magnetic domains along the guide structure of that plate, the corresponding respective switches in respective plates being shifted with respect to each other, defining predetermined time-dependent operations specific for each plate for providing selective storage of information.

2. A storage device as claimed in claim 1, wherein said input structure comprises a parallel-connection of a plurality of diverging switches and converging switches.

3. A storage device as claimed in claim 1, wherein for each plate a domain can be driven as desired along the switching device by co-operation of a rotary magnetic field sequence and a locally present second domain.

4. A storage device as claimed in claim 1, wherein said diverging switches situated in said input structures are connected in each of said plates to one of said domain destruction devices, thereby forming an output structure with a specific output operation for the selective destruction of domain information.

5. A storage device as claimed in claim 4, wherein said output structure comprises a parallel-connection of a number of diverging switches and converging switches.

6. A storage device as claimed in claim 1, wherein for each plate, said input structure comprises a series-connection of one of said diverging switches for forming a specific input operation, and a domain splitting device for repeatedly splitting a domain in a selected plate.

7. A storage device as claimed in claim 6, wherein said domain splitting device comprises a loop guide structure comprising a first diverging switch having an output connected to a domain destruction element, and a domain splitter having a first output which closes said loop guide structure, and second output constituting an output of said domain splitting device.

8. A storage device as claimed in claim 7, wherein said second output is connected to a second diverging switch, having outputs which are connected to said domain destruction device and to an input of said storage structure.

9. A storage device as claimed in claim 8, wherein for each plate a domain can be formed by the domain generating device under the control of the rotary magnetic field.

10. A storage device, comprising
a rotary magnetic field generator, and
at least two plates of magnetic material in which magnetic domains can be sustained by an external field transverse to said plate, said magnetic domains being drivable, under the control of a field of said rotary magnetic field generator, along a domain guide structure on said plate comprising discrete elements including an input structure, a storage structure, and a switching device along which the domains can be driven in a predetermined manner under control of sequences of rotary magnetic fields applied by said magnetic field generator, said switching device comprising at least two series-connected diverging switches which are arranged in four orientations including at least one input orientation and one output orientation, said four orientations corresponding to the respective orientations of said discrete elements of said domain guide structure, said switches defining a predetermined sequence of time-dependent operations for the selective storage of information in each of said plates.

11. A magnetic domain storage device, comprising at least two plates of magnetic material capable of maintaining magnetic domains therein;
a domain guide structure in each of said plates for guiding the transport of said magnetic domains therein along respective sequences of preferential positions actuatable by an inplane magnetic field in successive corresponding directions;
at least one diverging switching device in each of said plates for altering the path of said magnetic domains along corresponding guide structure portions; and
means for controlling movement of domains in a predetermined one of said plates by means of said switching devices having different respective shift positions specified on the basis of a predetermined sequence of time-dependent operations, said sequence distinguishing said predetermined one of said plates for selectively altering the paths of magnetic domains under synchronized transport thereof through said portions.

* * * * *